United States Patent [19]

Huntsinger et al.

[11] 4,124,845
[45] Nov. 7, 1978

[54] MULTIPLEXED DIGITAL/ANALOG CONVERSION OF PLURAL DIGITAL SIGNALS

[75] Inventors: Dean P. Huntsinger, Marion; Thomas A. Pearson, Cedar Rapids, both of Iowa

[73] Assignee: Rockwell International Corporation, El Segundo, Calif.

[21] Appl. No.: 708,787

[22] Filed: Jul. 26, 1976

[51] Int. Cl.² .......................................... H03K 13/02
[52] U.S. Cl. ...................... 340/347 DA; 235/92 CV; 235/92 GT; 340/347 M; 340/347 SY
[58] Field of Search .... 340/347 DA, 347 M, 347 SH, 340/347 SY; 235/92 CV

[56] References Cited

U.S. PATENT DOCUMENTS

| | | | |
|---|---|---|---|
| 3,646,545 | 2/1972 | Naydan et al. | 340/347 DA X |
| 3,654,560 | 4/1972 | Cath et al. | 340/347 NT X |
| 3,743,939 | 7/1973 | Munt | 340/347 NT X |
| 3,993,992 | 11/1976 | Zwack | 340/347 C |
| 3,993,993 | 11/1976 | Griffin | 340/347 SY |

FOREIGN PATENT DOCUMENTS 950,097  2/1964  United Kingdom ................ 340/347 M

OTHER PUBLICATIONS

Bares et al, COMBINED ADC-DAC, IBM Technical Disclosure Bulletin, vol. 10, No. 9, 2/1968, pp. 1372,1373.

Primary Examiner—Thomas J. Sloyan
Attorney, Agent, or Firm—Howard R. Greenberg; H. Fredrick Hamann

[57] ABSTRACT

Plural digital signals are converted to plural analog signals through a plurality of sample and hold circuits, there being one for each of the desired conversions, which sequentially sample a periodic signal on a repetitive basis in response to a sample control signal, and a plurality of digital counters, each being associated with a different one of the sample and hold circuits for receiving one of the digital signals and providing a digital count of clock pulses indicative thereof when enabled to provide the sample control signal upon the completion of its count, with each enabling period being initiated at the same cyclical point of the periodic signal and wherein the number of clock pulses generated in one cycle of the periodic signal is equal to the maximum count for the digital counters.

4 Claims, 3 Drawing Figures

MULTIPLEXED DIGITAL/ANALOG CONVERSION OF PLURAL DIGITAL SIGNALS

BACKGROUND OF THE INVENTION

The present invention pertains generally to digital/analog converters and in particular to a multiplexing arrangement for utilization therewith.

The proliferation of digital electronics has prompted a need for digital/analog converters for converting digital signals used therein to analog signals which are indigenous to the natural environment. Although there now exists a plethora of different types of such converters for converting a single digital signal to its analog equivalent, there is a noticeable lack of such equipment for efficiently converting a plurality of digital signals to a plurality of analog signals. For example, to convert a binary coded decimal (bcd) digital word, wherein each digit whose value lies in the range 0–9 is represented by a four-bit digital signal, to an analog equivalent, each digit would ordinarily be converted to its individual analog value through its own individual digital/analog converter, thus requiring as many converters as there are digits in the digital word. This replication of equipment is highly wasteful of resources, adding substantially to the cost of conversion.

When the digital signals constitute a varying bcd digital word indicative of dynamically varying information, quite often the analog signals corresponding to the individual digits thereof are used to visually display the converted decimal number. One venerable technique, based on analog signals developed long before digital electronics began burgeoning, employs a rotatable wheel for each digit that bears the numbers 0 through 9 around its rim and is driven by such as a synchro motor in response to the analog signal, with the automobile odometer being the most familiar example thereof. This technique is also commonly used in aircraft for displaying to the pilot various information such as bearings and distances used for navigational purposes. With this type of display, it is highly desirable to afford the viewer a dynamic indication of the displayed information as it varies so that changes can be anticipated which entails partially turning a wheel for a particular digit from one value to the next incremental value when the value of all the preceding digits is nine, thus indicating the approaching completion of a decadic count. As will be discussed hereinafter this obviates any information ambiguities. Although this feature, commonly referred to as geneva action, is intrinsic to information which is embodied in analog form, it is not so with respect to digital information.

With the foregoing in mind, it is primary object of the present invention to provide a new and improved digital/analog converter employing multiplexing for converting plural digital signals to plural analog signals.

It is a further object of the present invention to provide such a multiplexed digital/analog converter which affords a high degree of resolution albeit with a minimum amount of counting equipment.

It is still a further object of the present invention to provide such a multiplexed digital/analog converter which easily lends itself to affording geneva action.

The foregoing objects, as well as others, and the means by which they are achieved through the present invention may best be appreciated by referring to the Detailed Description of the Preferred Embodiment which follows hereinafter together with the appended drawings.

BRIEF DESCRIPTION OF THE INVENTION

In accordance with the stated objects, the present invention affords multiplexing in a digital/analog converter for converting plural digital signals to plural analog signals by employing a plurality of sample and hold circuits, there being one for each of the desired conversions and a plurality of digital counters, each one being associated with a different one of the sample and hold circuits for receiving a different one of the digital signals to be converted. The sample and hold circuits sequentially sample a periodic signal in response to a sample control signal on a repetitive basis with each sampled value being held until the next sample control signal is received by the associated circuit. The digital counters are periodically enabled to perform a digital count of clock pulses which is always initiated at the same cyclical point of the periodic signal to provide the sample control signal at the end of the count which is generated from the counter associated with the sample and hold circuit which is to perform the sampling in the sampling sequence. Each counter has a maximum count without recycling equal to the number of clock pulses generated during a cycle of the periodic cycle. To minimize the requisite counting equipment, each of the digital counters comprises a plurality of cascaded dividers with all but the last divider stage of each counter being common to all of the counters. Each of the last divider stages is connected to receive a different one of the digital signals to be converted. Logic circuitry is provided for controlling the sampling sequence so that the proper sample and hold circuit and its associated counter are always activated.

Geneva action is easily afforded by applying the digital signal for each significant digit beginning with a predetermined digit, such as the units, to the last divider stage of its associated counter and the digital signal for each digit less significant than the predetermined digit, such as the tenths, to a different one of the common dividers of the counters and incorporating into the logic circuitry means for clearing the common dividers at the beginning of a counting period corresponding to a particular significant digit greater than the predetermined digit whenever the value of the predetermined digit and any other significant digits between it and the particular significant digit are not all equal to nine. When all the values are nine, the digital signals applied to the common dividers are loaded thereinto, thus extending the count by a corresponding amount and consequently altering the analog signal obtained for the particular significant digit to force the associated display wheel to partially increment.

DETAILED DESCRIPTION OF THE PREFERRED EMBODIMENT

Figure 1:
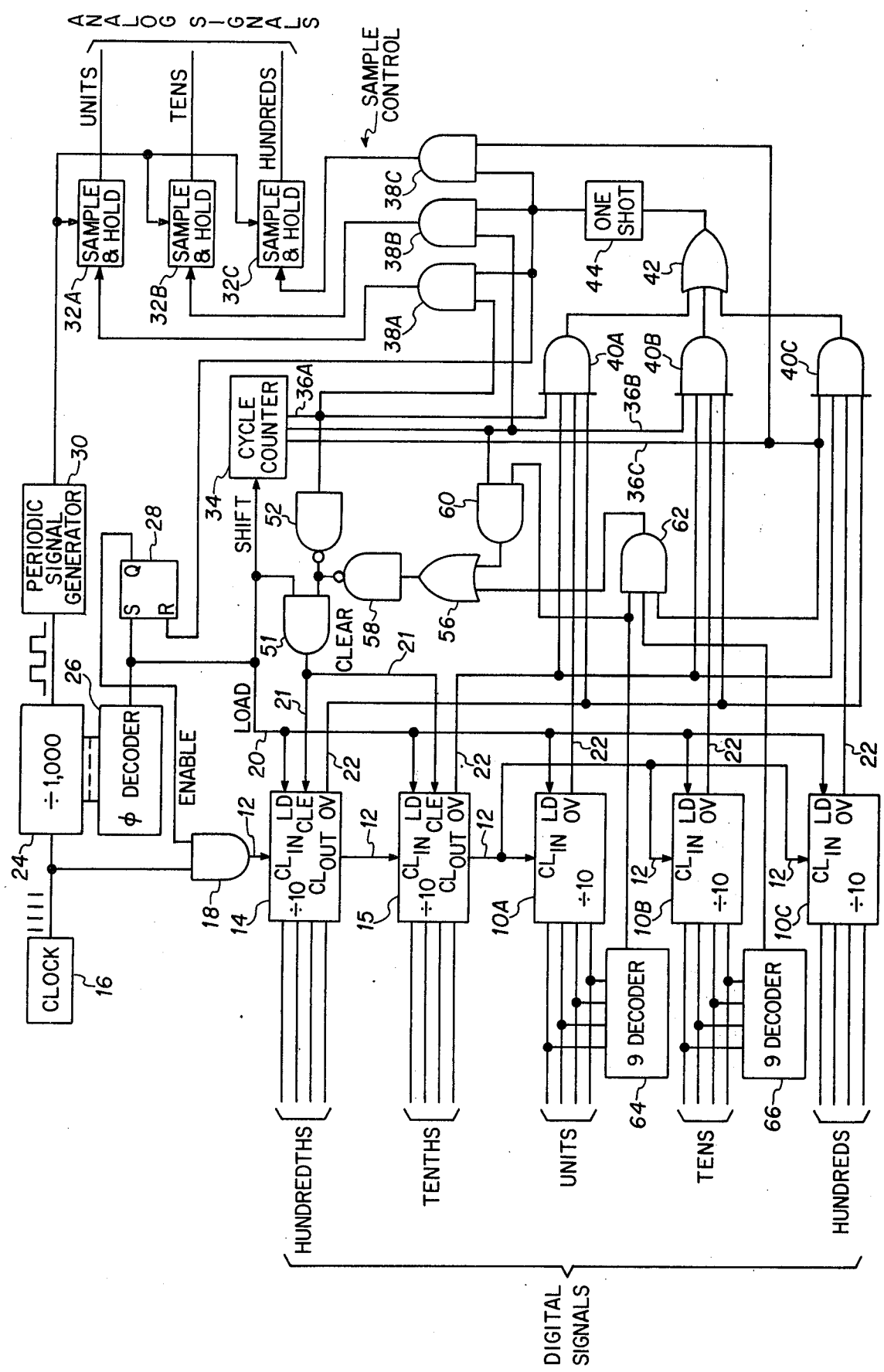
FIG. 1 depicts the block and logic elements of the multiplexed digital/analog converter of the invention in its preferred embodiment.

To facilitate presenting of the invention, it will be assumed only for illustrative purposes that the plural digital signals to be converted to plural analog signals constitute a bcd digital word with only the units digit and more significant digits being of interest so as to warrant display. As shown in FIG. 1, the units, tens and hundreds digits, as represented by four-bit binary values, are applied to three individual decade counters 10A-10C respectively, each of which is merely a divide by 10 frequency divider, thus requiring 10 pulses at its clock (CL IN) input on leads 12 to traverse a complete counting cycle before recycling. The less significant digits of the bcd digital word, namely, the hundredths and tenths digits are applied respectively to like decade counters (dividers) 14 and 15. It is to be noted that the clock (CL OUT) output of divider 14 is connected to the clock input lead 12 of divider 15 and that the clock (CL OUT) output of divider 15 is connected to the clock input leads 12 of all three dividers 10A-10C. Consequently, it will be observed that three different digital counters may be identified, each comprising three cascaded divider stages with the first two stages commonly employing dividers 14 and 15 and the last stage being one of the dividers 10A-10C. Dividers 10A, 10B and 10C, each in combination with dividers 14 and 15 constitute the units, tens and hundreds digital counters respectively, since they respectively receive the digital values thereof. Each counter is capable of a maximum count of 1000 before recycling, with each divider applying a clock pulse to the next divider stage whenever it reaches a zero digital count, defined as an overflow condition. It is to be noted that although a ripple counter is depicted, a synchronous counter with appropriate divider stage interconnections all receiving the same clock pulses would work just as well.

Counting is effectuated by applying a series of clock pulses to the clock input lead 12 of counter 14 from a clock source 16 via a first input of the AND gate 18 in the presence of a high level logic one enable signal on a second input thereof. As will be seen shortly, each counting cycle is begun with a load signal that is applied directly to the load (LD) input leads 20 of dividers 10A-10C to program them with their respective digital inputs. Although the load signal is likewise applied to dividers 14 and 15, it may be overridden by a clear signal applied via leads 21 connected to their clear (CLE) inputs through some logic circuitry to clear both counters 14 and 15 to force their digital count to zero at the beginning of the count, irrespective of the digital signals applied thereto dependent on particular conditions. For the time being, it may be assumed that the counters 14 and 15 are cleared at the beginning of each counting cycle so that they start off with a digital count equivalent to the digit value 0. All five dividers, 10, 14 and 15, are designed to count downward from their programmed digital count as loaded in at the beginning of the counting cycle and to provide a high level signal on their output overflow (OV) leads 22 whenever a zero digital count is achieved and to continually recycle so long as enabled. Whenever a digital count of a selected one of the three aforementioned digital counters, units, tens, or hundreds, is complete, as evidenced by high level signals on leads 22 of counters 14 and 15 and whichever one of dividers 10A-10C is selected (to be described hereinbelow), the enable signal applied to AND gate 18 is terminated so as to inhibit any further counting.

The pulse train output of clock 16 is also applied to a recyclable frequency divider 24 which produces at its output a square wave whose frequency is one thousandth of the clock frequency so that each cycle of the square wave corresponds to one thousand clock pulses or the maximum count of the three digital counters. Accordingly, any point in the cycle of the square wave may be determined by looking at the time for a count of one of the digital counters to be completed so long as the counting period is initiated at a known point of the cycle. The known point is determined by a phase decoder 26 connected to the digital output of divider 24 which provides a pulse at its output each time that the known point, as digitally represented, is detected. The output of the decoder 26 provides the aforementioned load signal for loading the dividers 10, 14 and 15, as well as a pulse for setting an R-S flip-flop 28 via its Set (S) input whose high level Q output at that time provides the aforementioned enable signal for initiating each counting period.

The square wave output of divider 24 is applied to a periodic signal generator 30 whose output may assume any desired periodic wave shape having a frequency that same as that of the square wave and controlled by either its rising or falling edge. The waveform will depend on the type of digital/analog conversion desired, for example, assuming a ramp for linear conversion or a sine wave for trigonometric conversion. In any event, the details of the periodic signal generator 30 will of course depend on the desired waveform with there being many wellknown types (such as phase lock loop circuit) for the foregoing waveforms as well as other commonly used waveforms.

The periodic signal generated at the output of generator 30 is applied to three sample and hold circuits, 32A-32C, each one for providing at its output a different one of the desired analog signals, with circuit 32A providing the analog value for the units digit of the bcd digital word, 32B providing the tens digit value and 32C the hundreds digit value. Each sample and hold circuit 32 samples the periodic signal in response to a sample control signal applied thereto and maintains the sampled value which constitutes the desired analog value at its output until the next sample control signal is applied thereto. Sampling is sequentially performed by the sample and hold circuits 32, with each sample being taken during a different cycle of the periodic signal. The sample control signal, which is sequentially applied to the sample and hold circuits 32 on a repetitive basis, occurs whenever one of the three digital counters completes its count as will now be explained.

Each of the digital counters is associated with a different one of the sample and hold circuits 32, with the units digital counter employing the divider 10A that receives the units digital signal being associated with the sample and hold circuit 32A that provides the units analog signal, the tens digital counter 10B employing the divider 10B being associated with the sample and hold circuit 32B and the hundreds digital counter employing the divider 10C being associated with the sample and hold circuit 32C. A cycle counter 34 which may be a simple three-bit ring counter is used to keep track of the cycle of the periodic signal which is being examined so as to route the sample control signal to the proper sample and hold circuit 32 as well as to monitor the proper digital counter associated therewith to determine when it has completed its count. This is accomplished by applying the load signal at the output of decoder 26 to the cycle counter 34 as a shift signal to indicate that a new cycle has begun causing the high level signal appearing at one of the three output leads 36A–36C of the counter 34 to advance to the next adjacent lead. Leads 36A–36C are connected as individual inputs to three AND gates 38A–38C (each lead going to the AND gate bearing the same letter designation as itself) whose outputs are individually connected to the sample and hold circuits 32 (likewise bearing the same letter designation). Consequently, when lead 36A is high AND gate 38A is partially enabled to apply a sample control signal to sample and hold circuit 32A, when lead 36B is high AND gate 38B is partially enabled to apply a sample control signal to sample and hold circuit 32B, etc. Assuming an alphabetical sampling sequence, after sample and hold circuit 32C performs its sample function while lead 36C is high, the process is repeated with sample and hold circuit 32A while lead 36A is high on the very next periodic signal cycle (or any other successive cycle dependent on the time constant of the particular sample and hold circuit employed).

Three AND gates 40A–40C are used to determine when a digital counter has completed its count with the letter designation of the AND gate identifying the sample and hold circuit 32 and divider 10 comprising the associated digital counter with which it is associated. Accordingly, one of the four inputs of AND gate 40A is connected to the overflow output lead 22 of divider 10A while a second of its inputs is connected to output lead 36A of cycle counter 34. Likewise, one of the four inputs to AND gate 40B is connected to the overflow output lead 22 of decade counter 10B while a second of its inputs is connected to lead 36B of cycle counter 34. AND gate 40C is similarly connected. The other two inputs of each of the AND gates 40 are derived from the overflow outputs 22 of dividers 14 and 15. Since one of the three output leads 36 of cycle counter 34 is always high, one of the AND gates 40A–40C will always be partially enabled to produce a high signal at its output as soon as the other three inputs thereto from one of the digital counters completes its count to produce a high level signal on all three of its output overflow leads 22. At that point, an OR gate 42 whose inputs are derived from the outputs of AND gates 40 actuates a one shot multivibrator 44 that produces a pulse at its output for fully enabling whichever one of the AND gates 38 is partially enabled by connection to a high level output lead 36 of cycle counter 34 to generate a sample control signal, thereby allowing its associated sample and hold circuit 32 to sample the periodic signal at the output of generator 30. The output of the one shot 44 is also applied to the reset (R) input of flip-flop 28 to reset it, thereby driving its Q output low so as to inhibit any further clock pulses from being applied to divider 14 and terminating the count. Upon the next consecutive cycle as detected by decoder 26, the foregoing process is repeated with the setting of flip-flop 28. It is to be noted that the degree of resolution for conversion is determined by the maximum realizable count afforded in great part by the common cascaded dividers, so that high resolution can be achieved albeit with a minimum amount of counting equipment.

Figure 2A:
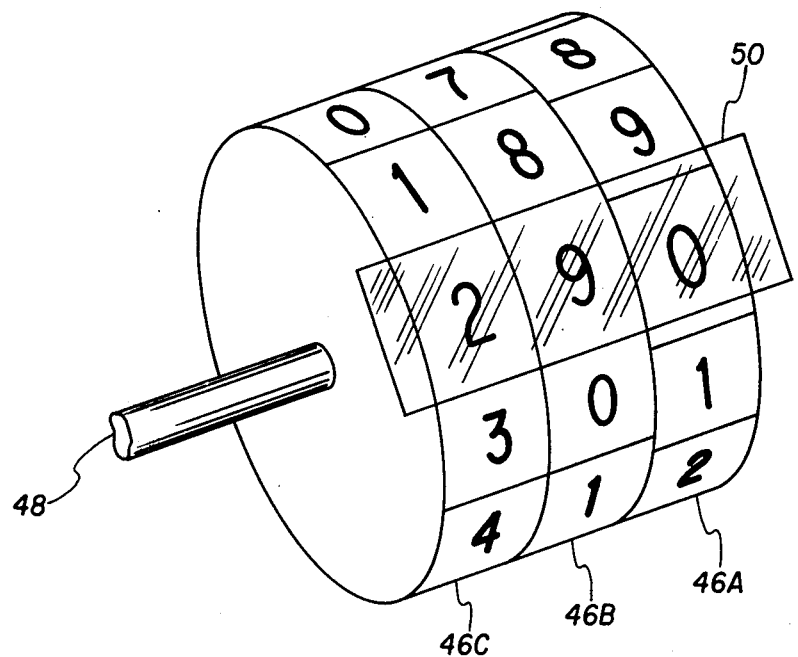
FIGS. 2A and 2B show a rotary wheel display device helpful to understanding how geneva action is afforded by the invention.
Figure 2B:
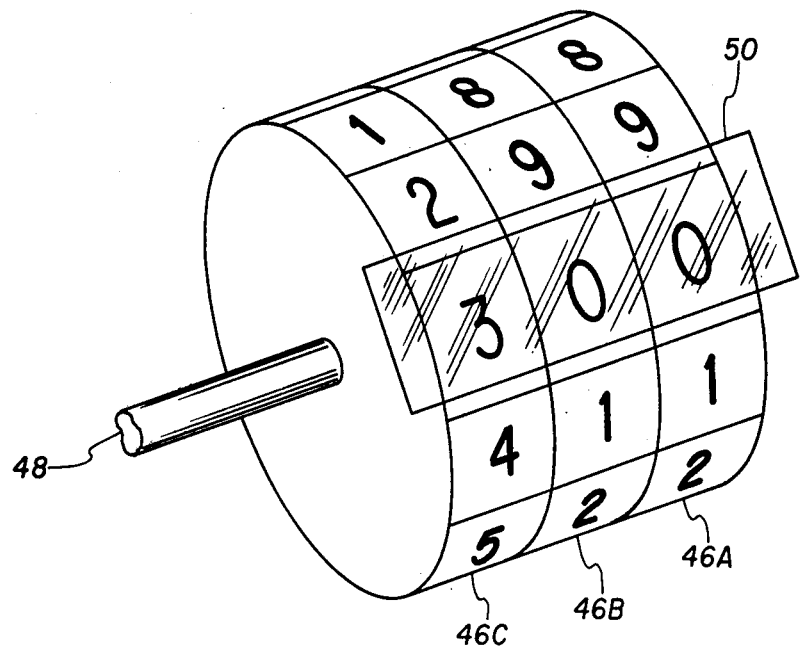

The invention depicted in FIG. 1 easily lends itself to affording the geneva action which was discussed under Background of the Invention and which is illustrated in FIGS. 2A and 2B wherein three rotary display wheels 46A–46C are individually rotatable about a common axis 48. Each wheel bears the digit values 0 through 9 around its rim which are visible through a viewing window 50 to display a three digit number, with wheel 46A exhibiting the units digit, 46B the tens digit, and 46C the hundreds digit. Each of the wheels 46 might be driven by an individual synchro motor (not shown) under the control of the analog signal applied thereto which is derived from its respective sample and hold circuit 32 output. To illustrate the effect of geneva action, let us assume that the bcd digital word of FIG. 1 represents the decimal number 299 which is dynamically changing to a value of 300 and is about to make the transition thereto (bearing in mind that the unit wheel 46A continuously rotates in analog fashion). Without geneva action, a viewer looking at the display of FIG. 2A would not be able to anticipate that the information displayed is changing from 299 to 300 since the number 300 would not be displayed until its digital equivalent actually occurs. Moreover, an ambiguity in the information exists since a viewer who was not continually observing the display prior to that depicted in FIG. 2A would be deceived into thinking that the displayed information in FIG. 2A is 290 and not as in fact some value between 299 and 300. This is not acceptable for equipment used in aircraft where delayed action predicated on erroneous information even though it may be so only briefly can prove catastrophic under exigent circumstances. However, with geneva action, a viewer looking at the display of FIG. 2B could anticipate the transition of the information from 299 to 300 since the nine value for both the units and tens digits permits the hundreds digit wheel 46C to begin rotating so as to change the digit appearing in the window from a 2 to a 3, the amount of rotation being dependent on the value of the tenths and hundreds digits, thereby obviating any ambiguity problem.

Without geneva action, the sample and hold circuit 32 outputs represent the analog equivalent of the tens and hundreds digital inputs without being affected by the tenths and hundredths value of the bcd digital word. To incorporate geneva action into the invention of FIG. 1, all the sample and hold circuit 32 outputs are permitted to change in accordance with the values of the tenths and hundredths digits of the bcd digital word. This is accomplished by allowing those values to be loaded into their respective dividers 14 and 15 whenever the counting and sampling period corresponds to the units digital counter (continuous rotation always desired for the units digit) or when it corresponds to the tens digital counter and the value of the units digit is nine or when it corresponds to the hundreds digit and the value for both the units and tens digits is nine. With the dividers 14 and 15 programmed in accordance with the respective digital signals applied thereto at the beginning of the counting period, the period is extended by a corresponding amount to alter the associated converted analog signal accordingly. For example, the decimal 299.55 would produce a counting period for the hundreds digit corresponding to 255 clock pulses with geneva action whereas without it the counting period would correspond to only 200 clock pulses thereby affecting the corresponding analog value.

The foregoing geneva action is incorporated into the circuitry of FIG. 1 through logic circuitry which generates the clear signal, alluded to earlier, to override the load signal applied to dividers 14 and 15 at the beginning of a counting period to inhibit loading the digital signals for the tenths and hundredths digits of the bcd digital word at that time when appropriate.

The clear signal which takes the form of a high level one signal is generated at the output of an AND gate 51 which is connected to the clear input leads 21 of dividers 14 and 15 and has two inputs, one being derived from the output of decoder 26. The second input is connected to the output lead 36A via an inverter 52 so that whenever a units digit count is transpiring, the high level signal on lead 36A produces a low signal to inhibit AND gate 51 from generating a clear signal coincident with the load signal so as to preclude overriding it. Thus, continuous wheel rotation is always obtained for the units digit when the information is varying since the digital signals to the counters 14 and 15 are always loaded thereinto at the beginning of the units count.

The second input of AND gate 51 is also connected to the output of an OR gate 56 through an inverter 58 with the two inputs of OR gate 56 being connected individually to the output of two AND gates 60 and 62. One input to AND gate 60 is derived from lead 36B of cycle counter 34 while a second input thereto is derived from the output of a nine decoder 64 whose input is connected to the units digital signal that is applied to divider 10A. The output of nine decoder 64 is also connected as an input to AND gate 62 along with two other inputs, one being derived from lead 36C of cycle counter 34 and the other from the output of a nine decoder 66 whose input is connected to the tens digital signal that is applied to the divider 10B. Each decoder 64 and 66 detects the value nine for its respective digital input to produce a high level signal at its output which partially enables AND gates 60 and 62. It will be readily seen that during a counting cycle corresponding to the tens digit a value of nine for the units digit produces a low level signal at the output of inverter 58 (both inputs to OR gate 56 high so that its output is also high), and consequently a low level output for AND gate 51 thus inhibiting the clear signal from being generated and permitting the tenths and hundredths digital signals to be located into the counters 15 and 14 respectively, so as to afford geneva action. For any units digit value other than nine, a clear signal is generated for the tens counting period (decoder 64 output low) to inhibit the tenths and hundredths digital signals from being loaded into the counters 15 and 14, respectively, to preclude geneva action with respect to the tens digit. Similarly, the value of nine for both the units and tens digits inhibits the clear signal from being generated during a counting cycle for the hundreds digit so as to permit geneva action to occur, while a value other than nine for either the units or tens digit precludes geneva action.

Figure 3:
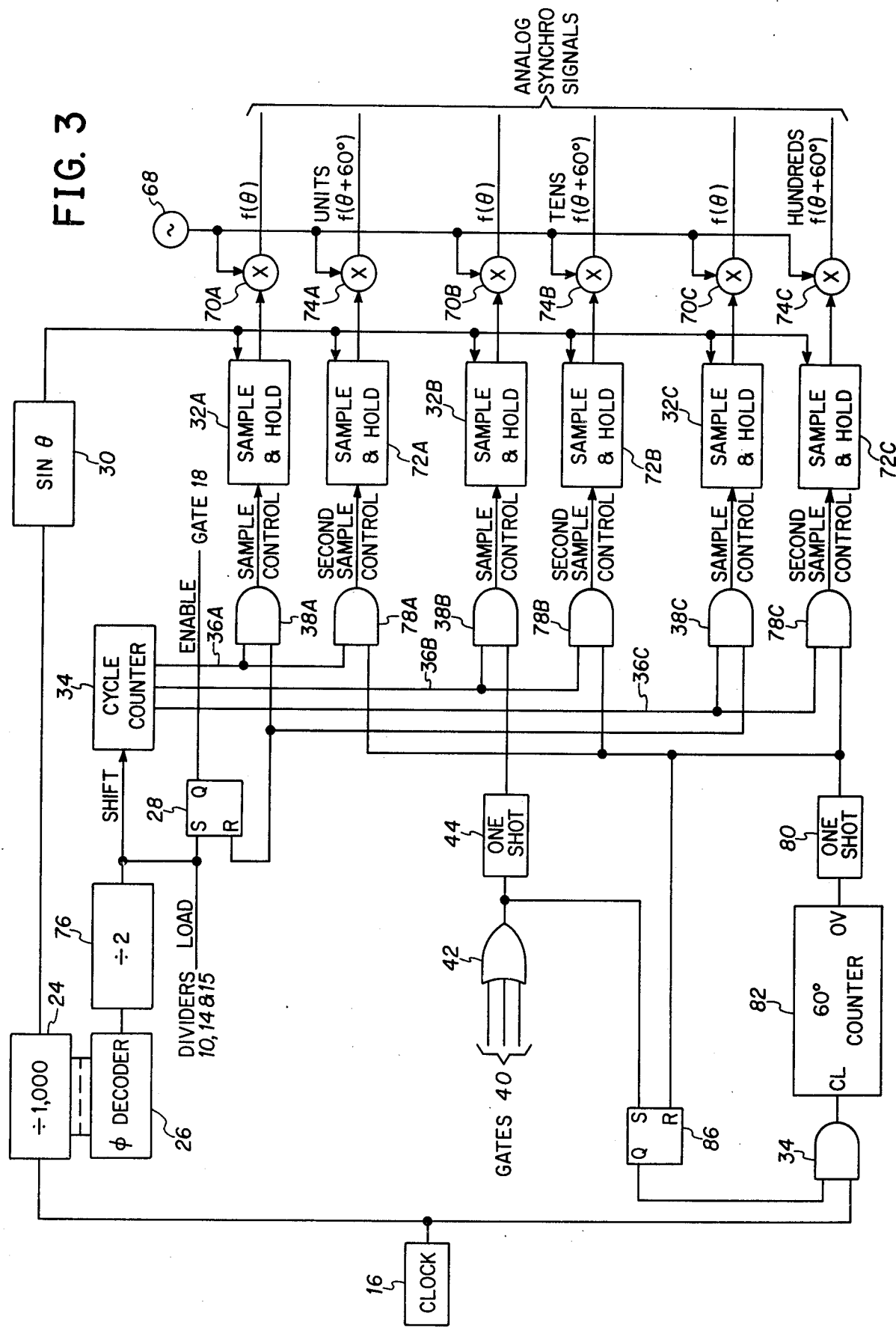
FIG. 3 depicts the additional block and logic elements supplementary to that of FIG. 1 for one particular manner of generating analog signals for geneva action.

Equipment supplementary to that of FIG. 1 for transforming the analog outputs of sample and hold circuits 32 to suitable signals for driving synchro motors that might be used to control the display wheels 46 is shown in FIG. 3, along with those portions of FIG. 1 (bearing the same reference numbers of FIG. 1) that are immediately relevant. A typical arrangement, such as fully delineated in an ARINC publication entitled "Synchro System Manual" (under the auspices of U.S. scheduled air carriers) for driving a three stator winding synchro motor is to ground one winding (commonly referred to as Z) and to apply two sinusoidal signals to the other windings (commonly referred to as X and Y) wherein the two sinusoidal signals are derived by modulating an A.C. carrier with two sinusoidal signals bearing the angular displacement $\theta$ information for the rotary wheels 46 (360° constituting a full decade count for a digit) that are the same but are displaced from one another by 60° measured in terms of the modulating signal periodicity. By employing a sine wave generator for periodic signal generator 30, and realizing that $\theta = 2\pi ft$, where $t$ represents time and $f$ is the periodic signal frequency, one of the synchro signals may be provided by multiplying the output of the sample and hold circuits 32 with an A.C. carrier signal supplied from an A.C. source 68 by individual multiplier circuits 70A–70C associated therewith (same letter designation relating a multiplier 70 with its associated sample and hold circuit 32). The second 60° phase displaced synchro signal is obtained by employing another set of sample and hold circuits 72A–72C and associated multiplier circuits 74A–74C. Each sample and hold circuit 32 thus has an associated sample and hold circuit 72 which is enabled to sample the output of generator 30, 60° of the sine wave period later in time after it itself has made a sample thereof. This is done by generating a second sample control signal following each sample control signal and applying it to the sample and hold circuit 72 which is associated with the sample and hold circuit 32 activated by the immediately preceding sample control signal. All of the analog signals provided at the output of the sample and hold circuits 32 and 72 are thus seen to be functions ($f$) of $\theta$ and $\theta + 60°$, respectively.

If the angle $\theta$ is greater than 300°, the second sample control signal will occur in the next consecutive cycle of the periodic signal following the cycle for which its associated sample control signal occurred. Since both sample control signals are related to and determined by the same digital counter, digital counting cannot be performed each and every cycle of the periodic signal. Consequently, the circuit of FIG. 1 is modified in FIG. 3 by interposing between the flip-flop 28 and decoder 26 a divide by 2 frequency divider 76 which causes flip-flop 28 to be set every other cycle of the periodic signal to obviate the problem. The output of divider 76 is likewise connected as the input to the cycle counter 34 so as to monitor every two cycles of the periodic signal rather than every one. Thus, each output lead 36 of cycle counter 34 remains high for two cycles of the periodic signal and is then shifted to the next adjacent lead.

The second sample control signal is generated and applied to the sample and hold circuits 72 through three AND gates 78A–78C, each having one input connected to an associated lead 36 of cycle counter 34 and a second input connected in common to the output of a one shot multivibrator 80. The input of one shot 80 is connected to the output overflow lead of a digital counter 82 which receives clock pulses from the clock source 16 via one input of an AND gate 84 having a second input connected to the Q output of an R-S flip-flop 86. The S input of flip-flop 86 is connected to the output of OR gate 42 while its R input is connected to the output of the one shot 80. The transition of the output of OR gate 42 from a low to a high signal to generate a sample control signal also sets flip-flop 86 thus permitting its high Q output to enable AND gate 82 to pass clock pulses to counter 80. The counter 80 is designed to traverse a full counting cycle corresponding to 60° of the period for the periodic signal at which time it activates the one shot 80 via its overflow lead to enable whichever one of the AND gates 76 is connected to a high output lead 36 to generate a second sample control signal, thus enabling its associated sample and hold circuit 72 to sample the output of generator 30. At that time, flip-flop 86 is also reset to prepare it for its next operation.

As the foregoing disclosure demonstrates, the subject invention affords a digital/analog converter with multiplexing for efficiently converting plural digital signals to plural analog signals and which lends itself easily to affording geneva action. The sharing of counting equipment by the digital counters minimizes the requisite investment, while affording a high degree of conversion resolution limited only by the maximum count employed. It will be readily recognized that all block and logic elements depicted herein are well known and commercially available. Since modifications to the Detailed Description herein can be made without detracting from the scope and spirit of the invention, it is to be understood that the foregoing disclosure is exemplary and not circumscriptive of the invention as it will now be claimed hereinbelow.

What is claimed is:

1. A multiplexed digital/analog converter responsive to clock pulses for converting a binary coded decimal digital word to a plurality of analog signals, comprising:
   a plurality of decade counters, each for receiving the digital signal for a different one of the digits of the word to control the digital count from which it begins counting the clock pulses, said digits including a predetermined digit and all digits more significant than said predetermined digit;
   at least one common decade counter connected in cascade before each of said plurality of counters for receiving the digital signal of a digit of the word less significant than said predetermined digit to control the digital count from which it begins counting the clock pulses, and
   logic circuit means for periodically enabling said common and plural counters to digitally count the clock pulses in accordance with the digital signals between a preset state determined thereby and a fixed state and sequentially converting to an analog value the individual count achieved by said plurality of decade counters in combination with said common counter, including means for clearing said common counter at the beginning of a count corresponding to a particular significant digit whenever the value of said predetermined digit and any other significant digits between it and said particular significant digit are not all equal to nine.

2. In combination with a digital/analog converter employing clock pulses for converting a binary coded decimal digital word to a plurality of analog signals, counting apparatus comprising:
   a plurality of decade counters, each for receiving the digital signal for a different one of the digits of the word to control the digital count from which it begins counting the clock pulses, said digits including a predetermined digit and all digits more significant than said predetermined digit;
   at least one common decade counter connected in cascade before each of said plurality of counters for receiving the digital signal of a digit of the word less significant than said predetermined digit to control the digital count from which it begins counting the clock pulses, and
   logic circuit means for periodically enabling said common and plural counters to digitally count the clock pulses in accordance with the digital signals and sequentially applying the outputs of said plurality of counters in combination with said common counter to the digital/analog converter, including means for clearing said common counter at the beginning of a count corresponding to a particular significant digit whenever the value of said predetermined digit and any other significant digits between it and said particular significant digits are not all equal to nine.

3. A multiplexed digital/analog converter for converting plural digital signals to plural analog signals, comprising:
   a source of clock pulses;
   signal generating means for providing a periodic signal whose frequency is less than that of said clock pulses;
   a plurality of sample and hold circuits equal in number to that of the analog signal, each for sampling said periodic signal in response to a sample control signal and maintaining the sampled value at its output until the next sample control signal is received;
   a plurality of digital counters, each being associated with a different one of said sample and hold circuits for receiving a different one of the digital signals to preset its counting state vis a vis some fixed counting state and providing a count of said clock pulses between said preset and fixed states when enabled, and having a maximum count without recycling equal to the number of clock pulses generated during one cycle of said periodic signal, wherein each of said digital counters comprises a plurality of cascaded decadic dividers with all but the last one of said dividers being common to all of said counters and wherein the digital signals constitute a binary coded decimal digital word with the digital signal for each significant digit beginning with a predetermined digit being applied to the last divider of its associated counter and the digital signal for each digit less significant than said predetermined digit being applied to a different one of the common dividers of said counters, and
   logic circuit means for periodically enabling said digital counters, each enabling period being initiated at the same cyclical point of said periodic signal and for generating and sequentially applying to said sample and hold circuits said sample control signal on a repetitive basis, each sample control signal being applied to a sample and hold circuit when its associated digital counter had completed its count, said logic means further including means for clearing said common dividers at the beginning of an enabling period corresponding to a particular significant digit greater than said predetermined digit whenever the value of said predetermined digit and any other significant digits between it and said particular significant digits are not all equal to nine.

4. A multiplexed digital/analog converter for converting plural digital signals to plural analog signals, comprising:
   a source of clock pulses;
   signal generating means for providing a sine wave signal whose frequency is less than that of said clock pulses, said means comprising a frequency divider for reducing the frequency of said clock pulses to provide a square wave having a frequency equal to that of the sine wave signal and a signal generator to convert the square wave to a sine wave;

a plurality of sample and hold circuits equal in number to that of the analog signal, each for sampling said periodic signal in response to a sample control signal and maintaining the sampled value at its output until the next sample control signal is received;

an AC signal source;

a plurality of multiplier circuits, each being connected to a different one of said sample and hold circuits for multiplying its output by the output of said AC signal source;

a plurality of digital counters, each being associated with a different one of said sample and hold circuits for receiving a different one of the digital signals to preset its counting state vis a vis some fixed counting state and providing a count of said clock pulses between said preset and fixed states when enabled, and having a maximum count without recycling equal to the number of clock pulses generated during one cycle of said periodic signal, wherein each of said digital counters comprises a plurality of cascaded decadic dividers with all but the last one of said dividers being common to all of said counters and wherein the digital signals constitute a binary coded decimal digital word with the digital signal for each significant digit beginning with a predetermined digit being applied to the last divider of its associated counter and the digital signal for each digit less significant than said predetermined digit being applied to a different one of the common dividers of said counters;

logic circuit means for periodically enabling said digital counters, each enabling period being initiated at the same cyclical point of said periodic signal and for generating and sequentially applying to said sample and hold circuits said sample control signal on a repetitive basis, each sample control signal being applied to a sample and hold circuit when its associated digital counter has completed its count, said logic means further including means for clearing said common dividers at the beginning of an enabling period corresponding to a particular significant digit greater than said predetermined digit whenever the value of said predetermined digit and any other significant digits between it and said particular significant digits are not all equal to nine, and a plurality of circuits, each being like and associated with an individual sample and hold circuit and its associated multiplier circuit and similarly connected and wherein said logic circuit means includes time delay means for providing a second sample control signal subsequent to each sample control signal delayed therefrom by a predetermined amount and prior to the next consecutive sample control signal, each second sample control signal being applied to the like sample and hold circuit associated with the sample and hold circuit which just received the immediately preceding sample control signal.

* * * * *